(12) United States Patent
Yang

(10) Patent No.: US 10,770,395 B2
(45) Date of Patent: Sep. 8, 2020

(54) SILICON CARBIDE AND SILICON NITRIDE INTERCONNECTS

(71) Applicant: International Business Machines Corporation, Armonk, NY (US)

(72) Inventor: Chih-Chao Yang, Glenmont, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/178,570

(22) Filed: Nov. 1, 2018

(65) Prior Publication Data

US 2020/0144195 A1 May 7, 2020

(51) Int. Cl.
*H01L 23/532* (2006.01)
*H01L 21/768* (2006.01)

(52) U.S. Cl.
CPC .... *H01L 23/53238* (2013.01); *H01L 21/7684* (2013.01); *H01L 21/76802* (2013.01); *H01L 21/76852* (2013.01); *H01L 21/76877* (2013.01); *H01L 23/53295* (2013.01)

(58) Field of Classification Search
CPC ....... H01L 21/76; H01L 21/768; H01L 23/53; H01L 23/532; H01L 23/53238
USPC ...................................................... 257/751
See application file for complete search history.

(56) References Cited

U.S. PATENT DOCUMENTS

| | | | |
|---|---|---|---|
| 6,514,671 B1 | 2/2003 | Parikh | |
| 6,541,367 B1 | 4/2003 | Mandal | |
| 6,740,579 B2 * | 5/2004 | Andideh | H01L 21/76807 257/759 |
| 7,239,017 B1 | 7/2007 | Yu | |
| 8,404,582 B2 | 3/2013 | Horak | |
| 8,486,832 B2 | 7/2013 | Morinaga | |
| 8,927,413 B2 * | 1/2015 | Huang | H01L 21/7682 438/622 |
| 9,754,778 B2 * | 9/2017 | Gstrein | H01L 21/76802 |
| 9,818,668 B2 | 11/2017 | Gao | |
| 2003/0114000 A1 * | 6/2003 | Noguchi | H01L 21/02074 438/687 |

(Continued)

OTHER PUBLICATIONS

Itemperature and Field Interrelation Study of Low-K TDDB for CU Interconnects With and Without Liner—New Insights to the Roles of CU for a Competing Breakdown Process, Chen et al., 2013 IEEE, 2F.2.1-7.

*Primary Examiner* — Fazli Erdem
(74) *Attorney, Agent, or Firm* — Jeffrey S LaBaw; Steven J Meyers; Alvin Borromeo

(57) ABSTRACT

A method for fabricating an interconnect for integrated circuit is described. A recess is provided in a first dielectric layer comprising a first dielectric and a second dielectric layer comprised of a second dielectric. The first and second dielectric layers are disposed over a substrate. The second dielectric layer is disposed over the first dielectric layer. The recess is filled with a metal conductor. A chemical mechanical polishing process removes the metal conductor from field areas on the second dielectric layer. The second dielectric layer is removed. An interconnect element is created having a top face which protrudes higher than a top face of the first dielectric layer. The metal conductor of the interconnect element has direct contact with the first dielectric layer. In other aspects of the invention, the interconnect structure is described.

16 Claims, 20 Drawing Sheets

(56) References Cited

U.S. PATENT DOCUMENTS

| | | | |
|---|---|---|---|
| 2008/0102599 A1* | 5/2008 | Yang | H01L 21/76834 438/430 |
| 2010/0176514 A1* | 7/2010 | Yang | H01L 21/02068 257/761 |
| 2012/0153483 A1* | 6/2012 | Akolkar | H01L 21/76877 257/758 |
| 2012/0267785 A1* | 10/2012 | Oh | H01L 21/76826 257/751 |
| 2017/0271512 A1* | 9/2017 | Adusumilli | H01L 27/0924 |
| 2017/0278800 A1* | 9/2017 | Adusumilli | H01L 23/53266 |
| 2017/0365509 A1* | 12/2017 | Ryan | H01L 21/76814 |
| 2019/0006230 A1* | 1/2019 | Kuo | H01L 21/76802 |

* cited by examiner

SILICON CARBIDE AND SILICON NITRIDE INTERCONNECTS

BACKGROUND OF THE INVENTION

This disclosure relates to integrated circuit devices. More specifically, it relates to a method and structure to create interconnect structures in semiconductor devices with silicon carbide or silicon nitride insulators.

As the dimensions of modern integrated circuitry in semiconductor chips continue to shrink, conventional semiconductor manufacturing technologies are increasingly challenged to make smaller and smaller structures.

In conventional interconnects which use dielectrics such as silicon dioxide to insulate the conductor layers, a barrier or liner layer is often used to separate the conductor material, e.g., copper, from the dielectric. The barrier layers are used to prevent diffusion of the conductor into the dielectric. There are challenges with this approach. The liner layer takes part of the cross-section of the space allotted to the conductor. As the liner layer typically has poorer conductivity, this can be undesirable. Also, the use of a liner introduces two additional interfaces, i.e. between the dielectric and the liner and between the liner and the copper (Cu), which increases the chances of delamination and other adhesion problems.

There exist some dielectrics such as silicon carbide (SiC) and silicon nitride (SiN) which do not require a liner layer, since the conductor does not diffuse into these dielectrics. Although no liner or barrier layer is required for SiC and SiN insulators for Cu interconnects, planarization processes, such as chemical mechanical polishing (CMP) which are commonly used to define the interconnect structure is very challenging. For example, forming Cu interconnects in a Damascene type of structure using a CMP process creates recesses and severe dishing at the Cu interconnect.

Thus, it is desirable to provide processes which can be used to make improved interconnect structures for integrated circuitry using SiC or SiN insulators.

BRIEF SUMMARY

According to this disclosure, a method for fabricating an interconnect for integrated circuit is described. A recess is provided in a first dielectric layer comprising a first dielectric and a second dielectric layer comprised of a second dielectric. The first and second dielectric layers are disposed over a substrate. The second dielectric layer is disposed over the first dielectric layer. The recess is filled with a metal conductor. A chemical mechanical polishing process removes the metal conductor from field areas on the second dielectric layer. The second dielectric layer is removed. An interconnect element is created having a top face which protrudes higher than a top face of the first dielectric layer. The metal conductor of the interconnect element has direct contact with the first dielectric layer. In other aspects of the invention, the interconnect structure is described.

The foregoing has outlined some of the more pertinent features of the disclosed subject matter. These features should be construed to be merely illustrative. Many other beneficial results can be attained by applying the disclosed subject matter in a different manner or by modifying the invention as will be described.

BRIEF DESCRIPTION OF THE DRAWINGS

For a more complete understanding of the present invention and the advantages thereof, reference is now made to the following descriptions taken in conjunction with the accompanying drawings which are not necessarily drawing to scale, and in which.

DETAILED DESCRIPTION OF THE DRAWINGS

Figure 1:
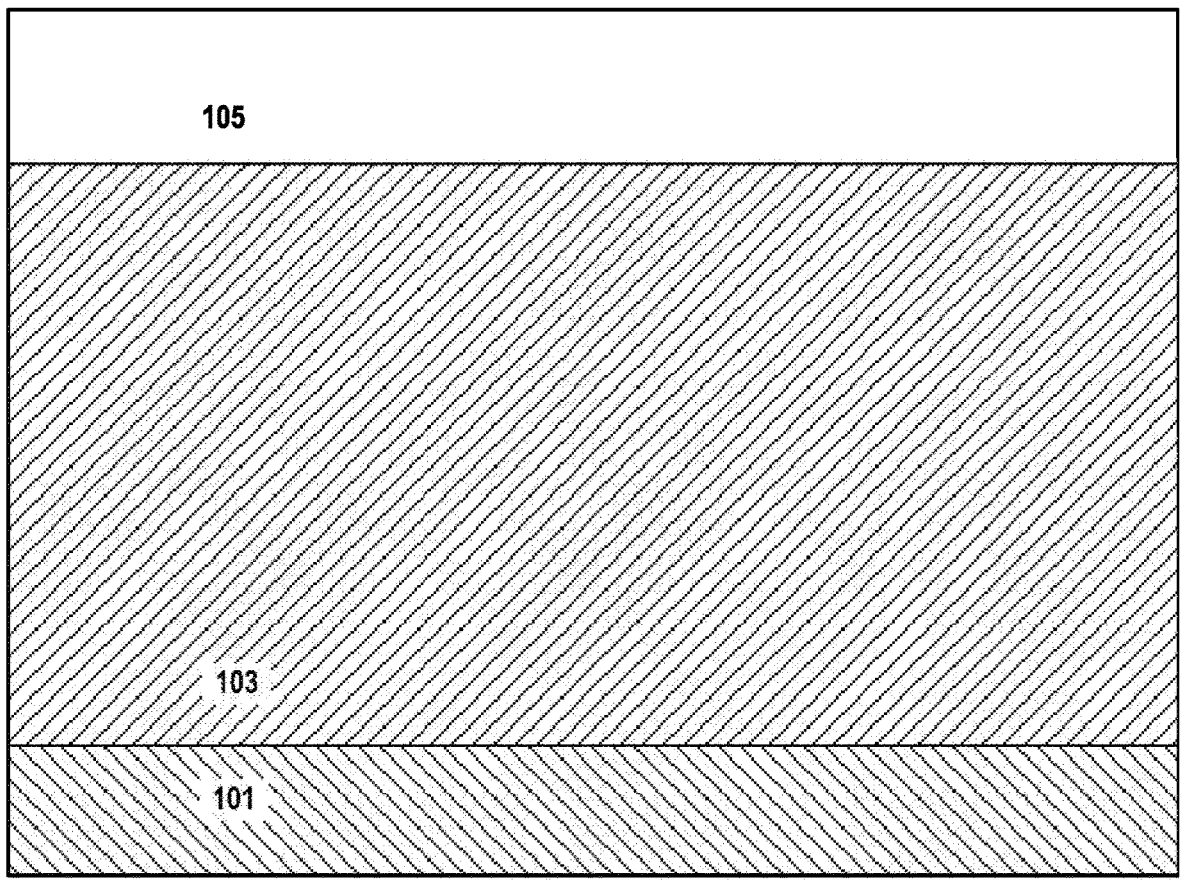
FIG. 1 is a cross-sectional diagram of a starting structure for embodiments of the invention.

At a high level, the invention includes processes and structures which allow interconnect structures to be fabricated using both non-oxygen containing insulators such as silicon carbide and silicon nitride and a planarization process such as chemical mechanical polishing (CMP) without the recesses and dishing problems. A major reason to replace a conventional SiO2 based inter-layer dielectric (ILD) with SiC or SiN is that no barrier liner required in the latter dielectric materials. This allows more volume of the interconnect to be allotted to the conductor, e.g., copper, and thus, better electrical performance compared to the conventional SiO2 based dielectric in which the barrier liner required. Embodiments of the invention use layers of a conventional SiO2 based dielectric, sometimes as a sacrificial layer, to allow the use of SiC and SiN based dielectrics in interconnect structures created through the use of CMP step.

A "substrate" as used herein can comprise any material appropriate for the given purpose (whether now known or developed in the future) and can comprise, for example, Si, SiC, SiGe, SiGeC, Ge alloys, GaAs, InAs, InP, other III-V or II-VI compound semiconductors, or organic semiconductor structures, etc. The substrate can also comprise dielectric materials as described below. Further, active devices may be embedded in the substrate.

For purposes herein, a "semiconductor" is a material or structure that may include an implanted impurity that allows the material to sometimes be conductive and sometimes be a non-conductive, based on electron and hole carrier concentration. As used herein, "implantation processes" can take any appropriate form (whether now known or developed in the future) and can comprise, for example, ion implantation, etc.

For purposes herein, an "insulator" is a relative term that means a material or structure that allows substantially less (<95%) electrical current to flow than does a "conductor." The dielectrics (insulators) mentioned herein, unless specified, can, for example, be grown from either a dry oxygen ambient or steam and then patterned. Alternatively, the dielectrics herein may be formed from any of the many candidate high dielectric constant (high-k) materials, including but not limited to hafnium oxide, aluminum oxide, silicon nitride, silicon oxynitride, a gate dielectric stack of SiO2 and Si3N4, and metal oxides like tantalum oxide that have relative dielectric constants above that of SiO2 (above 3.9). The dielectric can be a combination of two or more of these materials. The thickness of dielectrics herein may vary contingent upon the required device performance. The conductors mentioned herein can be formed of any conductive material, such as polycrystalline silicon (polysilicon), amorphous silicon, a combination of amorphous silicon and polysilicon, and polysilicon-germanium, rendered conductive by the presence of a suitable dopant. Alternatively, the conductors herein may be one or more metals, such as tungsten, hafnium, tantalum, molybdenum, titanium, or nickel, or a metal silicide, any alloys of such metals, and may be deposited using physical vapor deposition, chemical vapor deposition, or any other technique known in the art.

When patterning any material herein, the material to be patterned can be grown or deposited in any known manner and a patterning layer (such as an organic photoresist aka "resist") can be formed over the material. The patterning layer (resist) can be exposed to some form of light radiation (e.g., patterned exposure, laser exposure, etc.) provided in a light exposure pattern, and then the resist is developed using a chemical agent. This process changes the characteristic of the portion of the resist that was exposed to the light. Then one portion of the resist can be rinsed off, leaving the other portion of the resist to protect the material to be patterned. A material removal process is then performed (e.g., plasma etching, etc.) to remove the unprotected portions of the material to be patterned. The resist is subsequently removed to leave the underlying material patterned according to the light exposure pattern.

For purposes herein, "sidewall structures" are structures that are well-known to those ordinarily skilled in the art and are generally formed by depositing or growing a conformal insulating layer (such as any of the insulators mentioned above) and then performing a directional etching process (anisotropic) that etches material from horizontal surfaces at a greater rate than its removes material from vertical surfaces, thereby leaving insulating material along the vertical sidewalls of structures. This material left on the vertical sidewalls is referred to as a sidewall structure. The sidewall structures can be used as masking structures for further semiconducting processing steps.

A reason that the formation or dishing of the metal occurs in SiC and SiN based dielectrics is that the metal is much softer than those dielectrics and so takes the brunt of the mechanical forces during the CMP process. The SiO2 based dielectrics are softer resulting in a more uniformly planar surface.

Embodiments will be explained below with reference to the accompanying drawings.

FIG. 1 is a cross-sectional diagram of a starting structure for embodiments of the invention. The figure shows a starting structure including a substrate 101, a first dielectric 103 and a second dielectric 105. The substrate 101 is typically largely a semiconductor, but may also include logic and memory devices as well as dielectric and conductive materials. The first dielectric 103 is a dielectric in which the conductive material, e.g., copper, does not appreciably diffuse. Examples of the first dielectric 103 are silicon carbide (SiC) and silicon nitride (SiN), or other SiN, SiC based dielectrics, i.e. SiC(N,H). The second dielectric 105 is a dielectric in which the conductive material does diffuse, e.g. SiO2, or other SiO based dielectrics such as SiCOH. The first dielectric is a member of the group of dielectrics without oxygen bonds and the second dielectric is a member of the group of dielectrics with oxygen bonds.

As shown, in embodiments of the invention, the layer of first dielectric 103 is thicker than the layer of second dielectric 105. However, this is a matter of design of the interconnects as to the thickness of the respective layers.

The layers of dielectric material can be formed utilizing a conventional deposition process such as, for example, CVD, PECVD, and spin-on coating. The thickness of the layers of dielectric material may vary depending on the technique used to form the same as well as the material make-up of the layers and the design of the device, e.g., whether the layer is a via layer or a conductive line layer. Typically, the layers of dielectric material have thicknesses from 50 nm to 800 nm, with a thickness from 80 nm to 300 nm being more typical. Because the conductive interconnect elements are built inside the recesses provided in the dielectric layers, the finished metal elements, e.g., via or conductive line, will have corresponding thicknesses.

Figure 2:
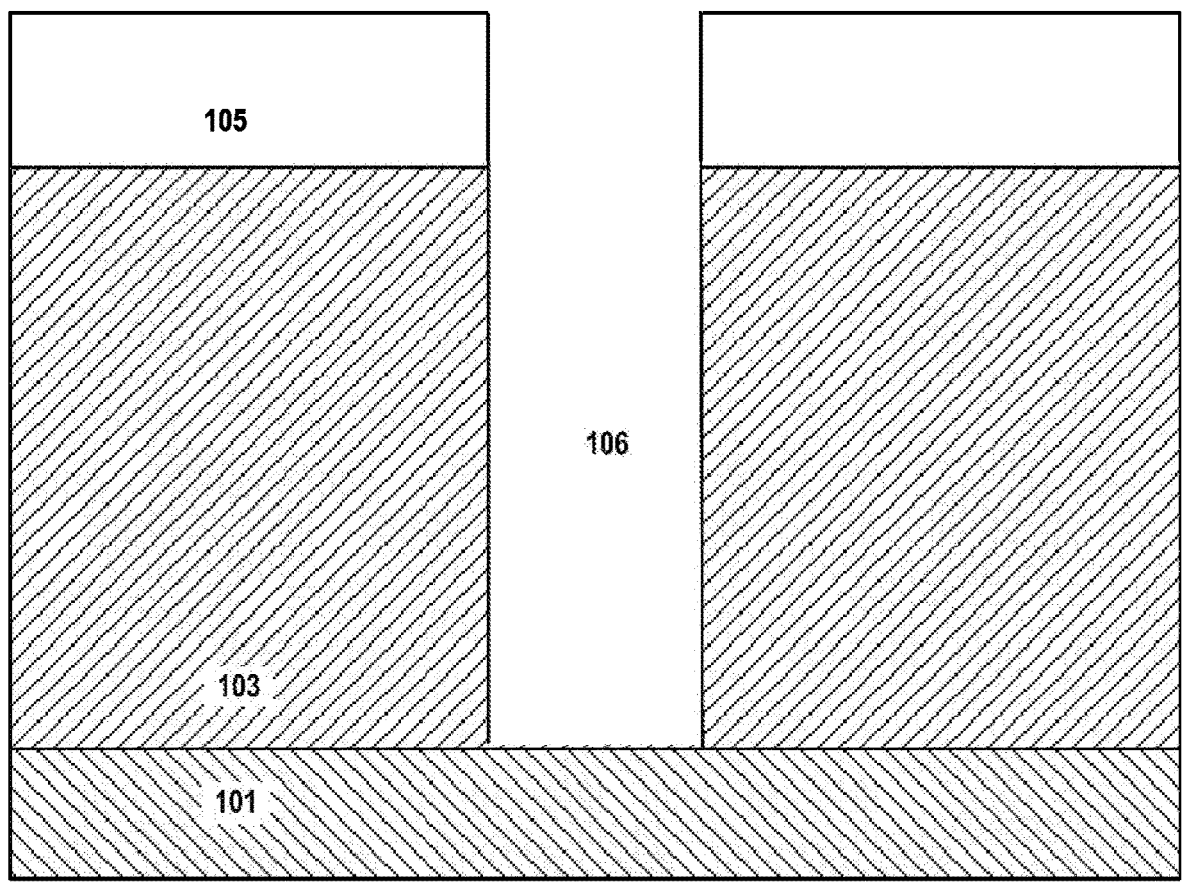
FIG. 2 is a cross-sectional diagram of an etched structure for a via or contact variant of a first embodiment of the invention.

FIG. 2 is a cross-sectional diagram of an etched structure for a via or contact variant of a first embodiment of the invention. In this variant of the invention, a recess 106 is etched through the first dielectric 103 and the second dielectric 105 for a via contact interconnect element. As compared to the recesses depicted in FIGS. 3 and 4, the via recess 106 is characterized by a long narrow hole which is cylindrical or rectangular in shape having a relatively equal depth (the dimension into the paper) as compared to the width depicted in the drawing. Also the height dimension is equal to the height dimensions or thicknesses of the first and second dielectric layers, 103, 105 and end on an underlying layer, in this example, the substrate layer 101.

Figure 3:
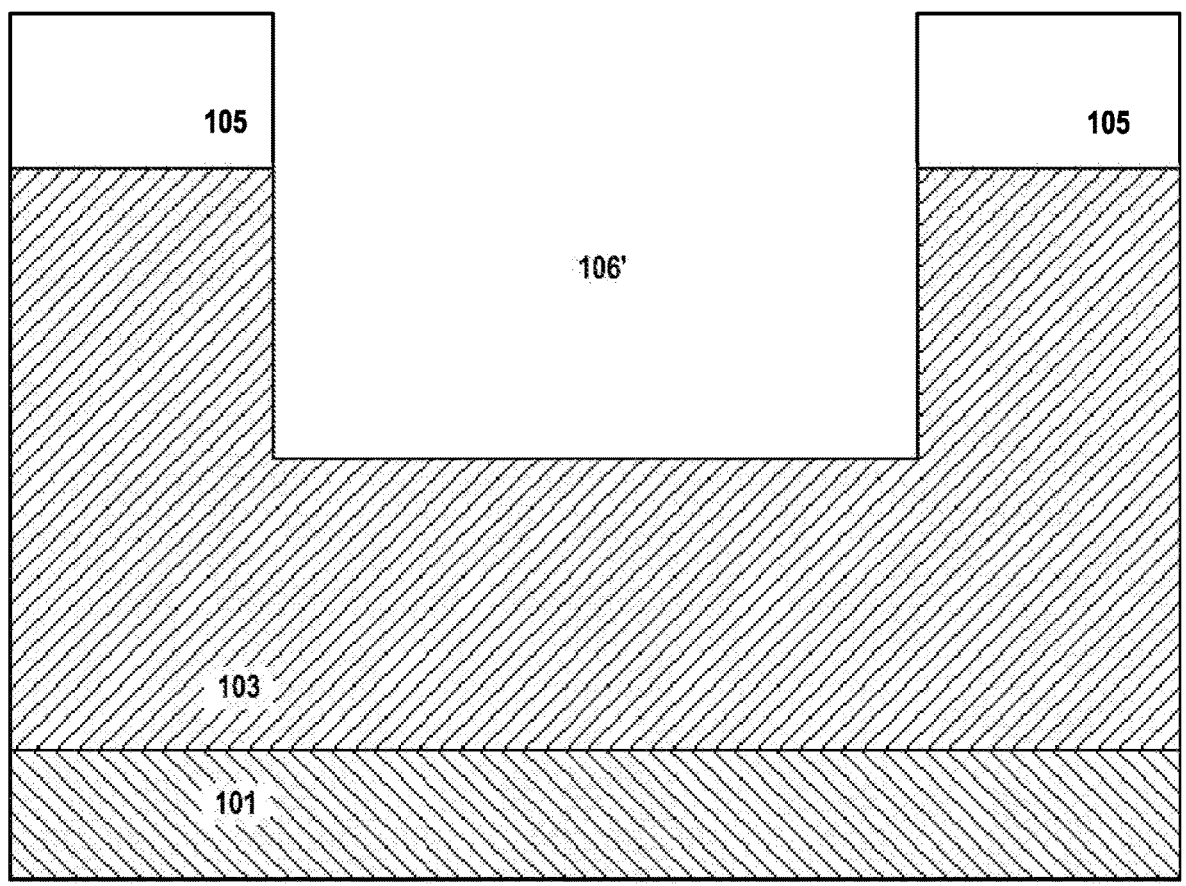
FIG. 3 is a cross-sectional diagram of an etched structure for a conductive line variant of a first embodiment of the invention.

FIG. 3 is a cross-sectional diagram of an etched structure for a conductive line variant of a first embodiment of the invention. In this variant of the invention, the recess 106' is etched through the second dielectric 105 but only partially through the first dielectric 103 for a conductive line interconnect element. As compared to the recesses depicted in FIGS. 2 and 4, the conductive line recess 106' is characterized by a long trench having a relatively greater depth (the dimension into the paper) as compared to the width depicted in the drawing. Also, the height dimension is equal to the height dimensions or thicknesses of the first dielectric layer 103 and a portion of the second dielectric layer 105.

Figure 4:
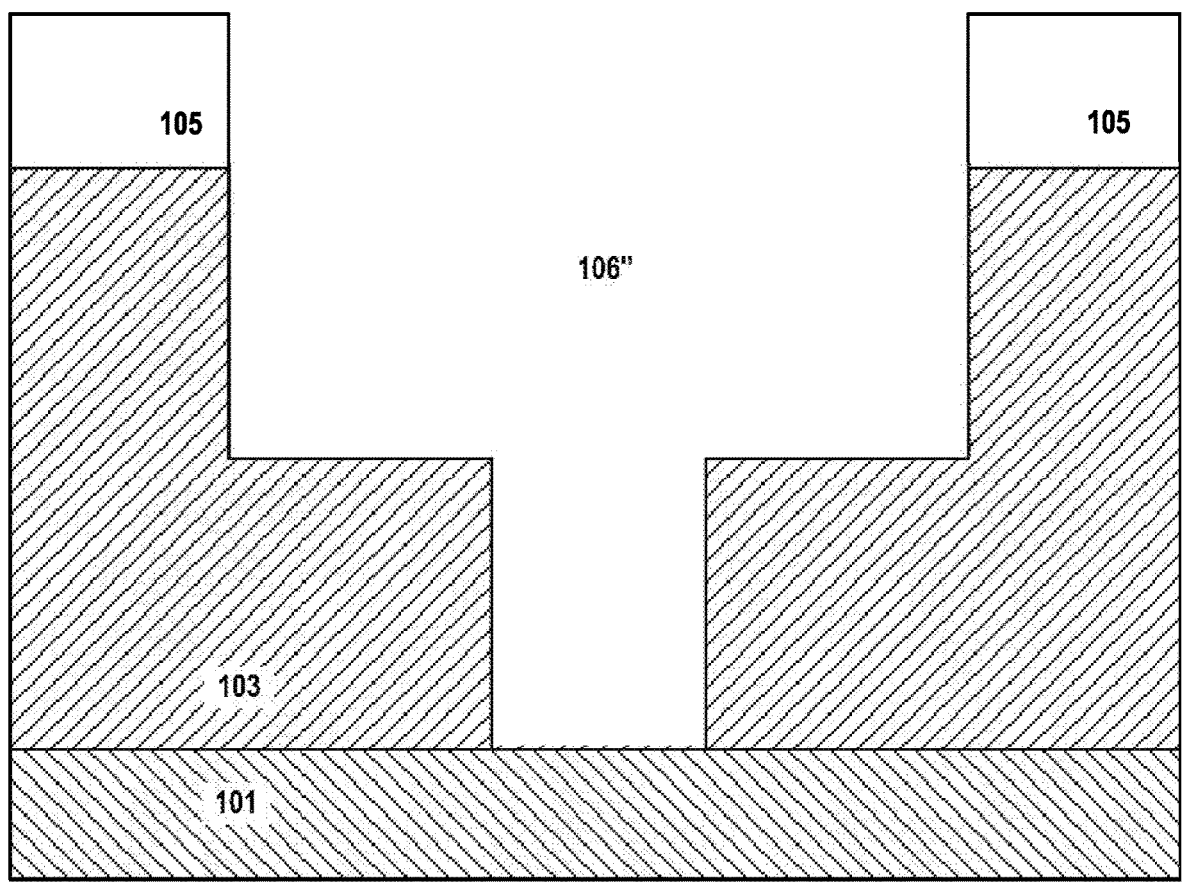
FIG. 4 is a cross-sectional diagram of an etched structure for a via and conductive line variant of a first embodiment of the invention.

FIG. 4 is a cross-sectional diagram of an etched structure for a via and conductive line variant of a first embodiment of the invention. In this variant of the invention, the recess 106' is etched through the second dielectric 105 but only partially through the first dielectric 103 for the conductive line portion, and all the way through the first dielectric 103 where the via or contact is formed for a combination conductive line, via contact interconnect element. This type of recess is sometimes called a double Damascene recess. As compared to the recesses depicted in FIGS. 2 and 3, the conductive line, via contact recess 106" is a combination of the two including both a long trench having a relatively greater depth (the dimension into the paper) as compared to the width depicted in the drawing and a via(s) which have relatively equal depth and width dimensions. Also the height dimension is equal to the height dimensions or thicknesses of the first dielectric layer 103 and a portion of the second dielectric layer 105 in the conductive line portion, and equal to the height dimensions of both the first and second layers in the via portion(s).

The drawings which follow mostly depict the via variant in the various embodiments. However, the reader is reminded that each of the variants can be fabricated according to the principles of the invention. That is, instead of starting with the metallized via or contact (See FIG. 8 below) and continuing with the processes described in the different embodiments, variants of the invention start with the metallized conductive line or the metallized conductive live and via combination and then continue with the processes in the different embodiments described below.

Figure 5:
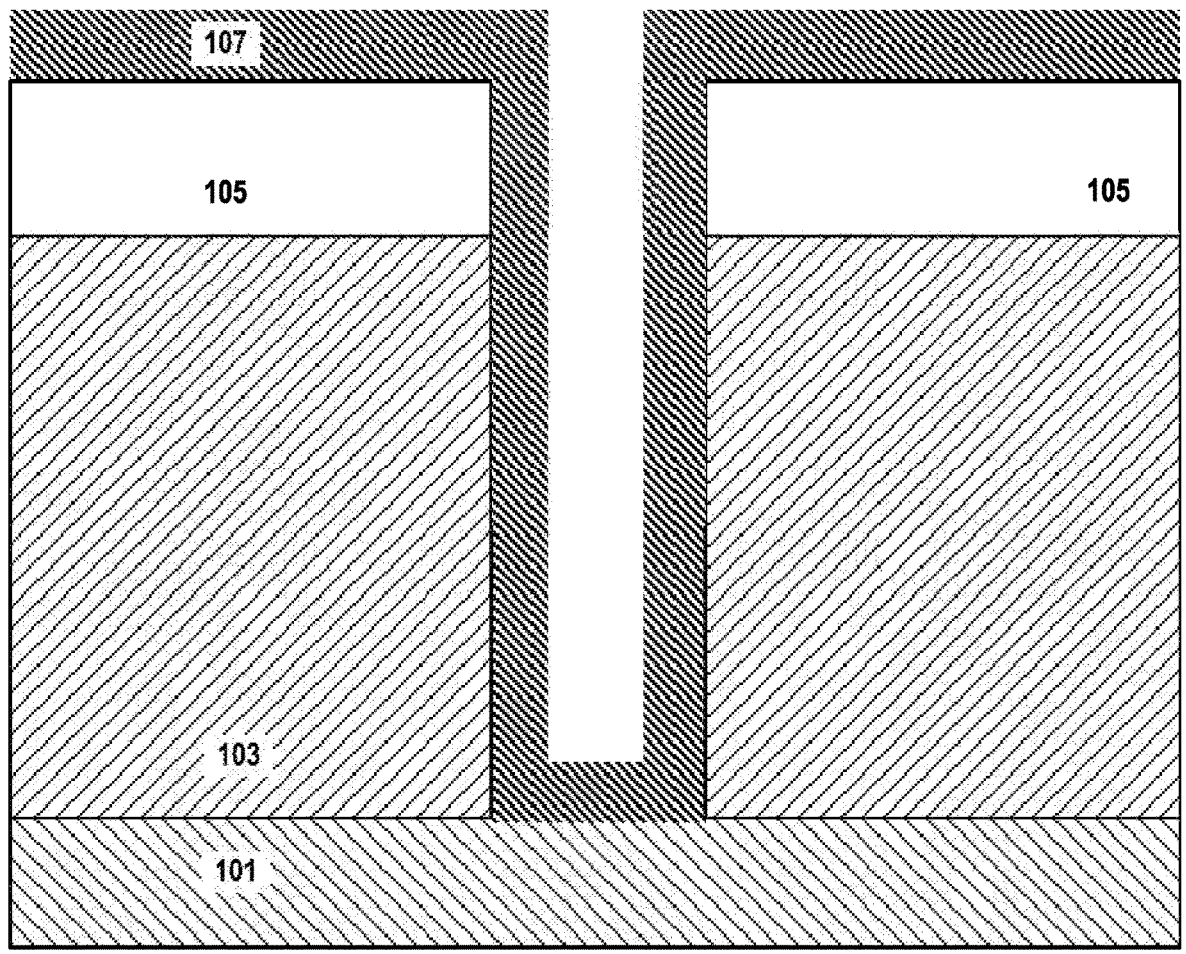
FIG. 5 is a cross-sectional diagram of the via or contact variant of a first embodiment of the invention after a copper seed deposition.

FIG. 5 is a cross-sectional diagram of the via or contact variant of a first embodiment of the invention after a copper seed deposition. In a preferred embodiment, a copper seed layer 107 is deposited. Conventional deposition processes such as a physical vapor deposition (PVD), an atomic layer deposition (ALD), chemical vapor deposition (CVD), plasma enhanced chemical vapor deposition (PECVD), electroless plating are used to deposit the metals or alloys in respective embodiments. As will be discussed below, an additional layer such a barrier layers or multiple layers of metal can be used in embodiments of the invention. In alternative embodiments, other metals such as Al, Al(Cu), Co, Ru, Ni, Ir, Rh and W are used. Although the drawing shows a conformal layer 107, that is not a requirement of the invention.

Figure 6:
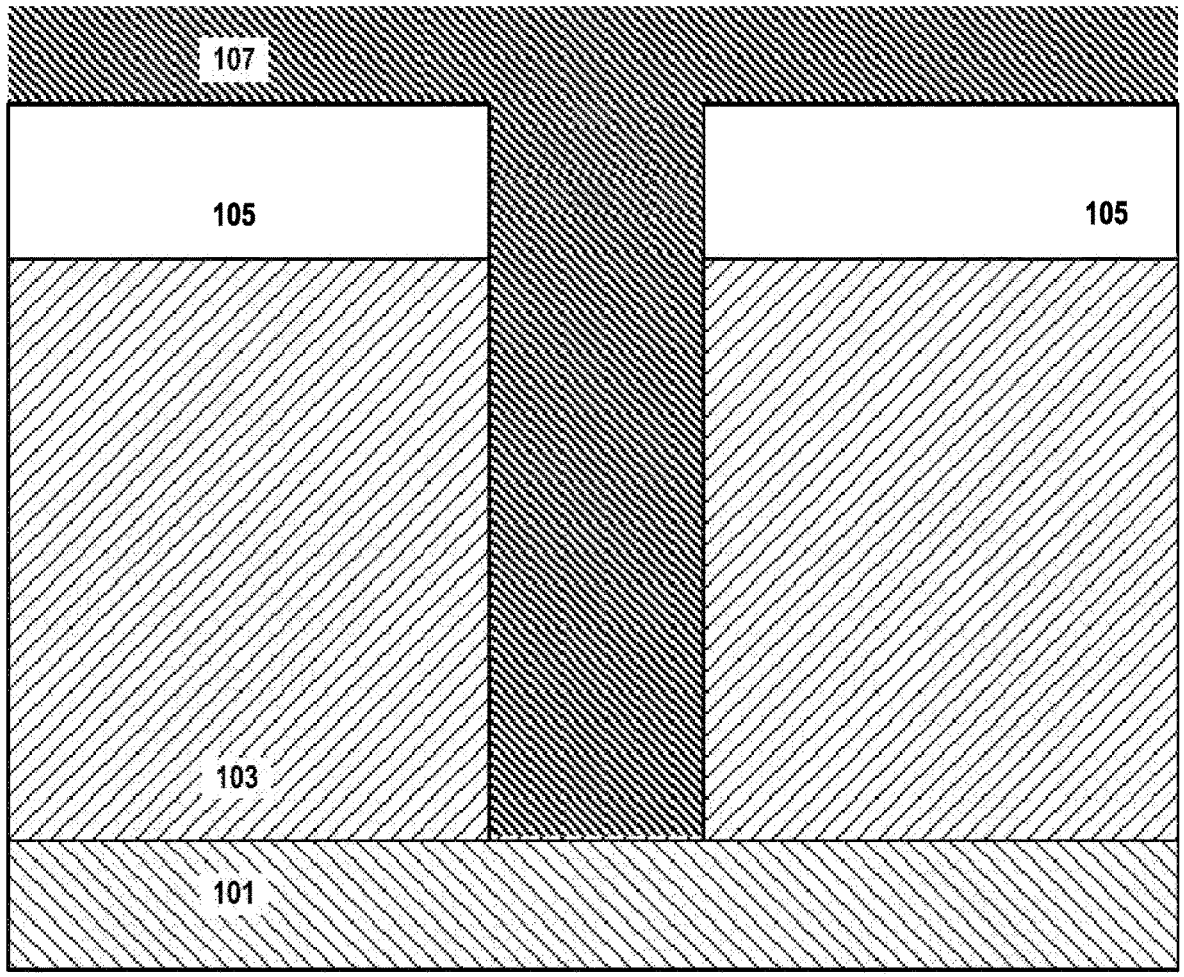
FIG. 6 is a cross-sectional diagram of the via or contact variant of a first embodiment of the invention after a plating or thermal reflow operation.

FIG. 6 is a cross-sectional diagram of the via or contact variant of a first embodiment of the invention after a plating or thermal reflow operation. As shown in the drawing, the metal layer 107 reflows into and fills the recess. During the reflow process, more of the seed layer reflows into the fuse element recess because of capillary action. The reflow of the seed layer is accomplished in some embodiments by a thermal anneal at a selected temperature between 100 to 400 degrees Centigrade for 30 minutes-3 hours in a thermal furnace. The thermal anneal can also be carried out at a selected temperature between 400 to 800 degrees Centigrade for 2 seconds-1 minute in a laser anneal plate. In both cases, the thermal anneal can be carried out in either an N2 or an N2/H2 ambience.

In the alternative, a second metal deposition step such as an electro-plating step after a PVD deposited seed layer can be used to fill the remainder of the recess. In the drawing, the same metal is used to complete the fill, so the metal 107 is shown as a single layer, however, in other embodiments a second type of metal is used to complete the fill.

As discussed in the description, the "first dielectric" 103 is a dielectric which does not require a barrier layer, e.g., SiC or SiN based materials, e.g., SiC (N, H) because the metal 107 does not diffuse substantially into the first dielectric layer 103. The "second dielectric" layer 105 does require a barrier layer in the final device because the metal 107 will diffuse into the "second dielectric" 105. Examples of the second type of dielectric include SiO2 and other SiO based materials.

Figure 7:
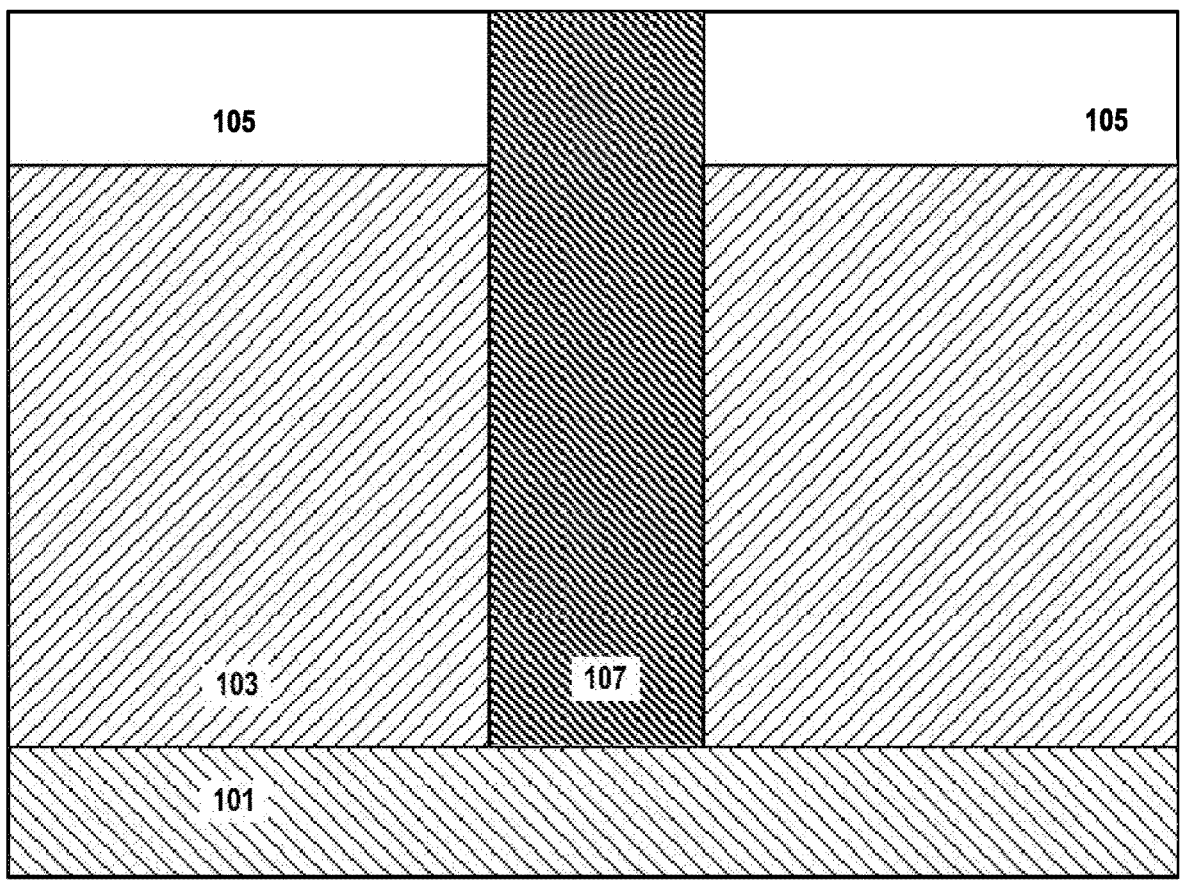
FIG. 7 is a cross-sectional diagram of the via or contact variant of a first embodiment of the invention after a chemical mechanical polishing (CMP) step has been performed.

FIG. 7 is a cross-sectional diagram of the via or contact variant of a first embodiment of the invention after a chemical mechanical polishing (CMP) step has been performed. In this drawing, planarization step has been performed to remove the metal 107 from on top of the field areas of the second dielectric 105. While the second dielectric has the disadvantage of being susceptible to diffusion of the metal 107, it has the advantage of not creating a recess or dishing during the CMP process. A chemical mechanical polishing (CMP) step is a widely used planarization process which is used in embodiments of the invention. Typically, a CMP process uses an abrasive and corrosive chemical slurry (commonly a colloid) in conjunction with a polishing pad. The pad and wafer are pressed together by a dynamic polishing head and held in place by a plastic retaining ring.

Figure 8:
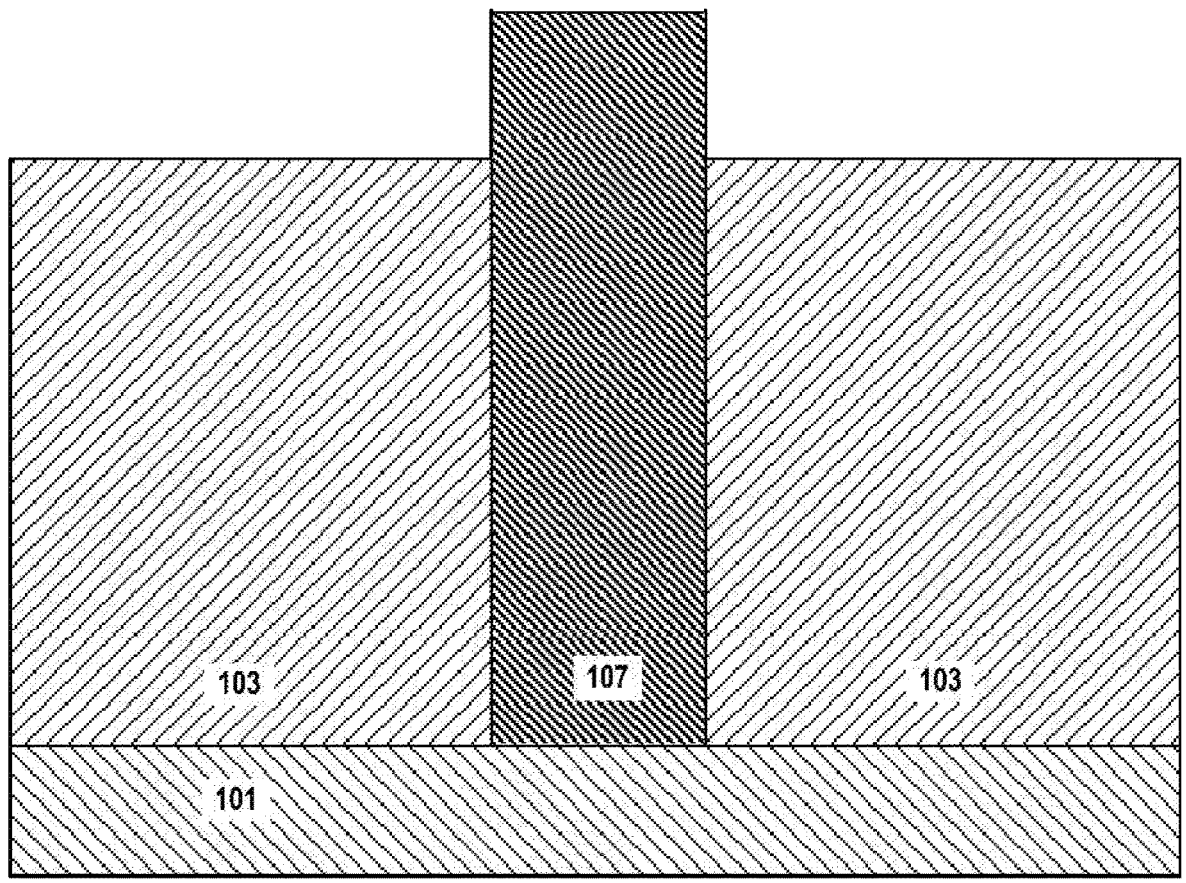
FIG. 8 is a cross-sectional diagram of the via or contact variant of a first embodiment of the invention after a removal step removing a second dielectric layer.

FIG. 8 is a cross-sectional diagram of the via or contact variant of a first embodiment of the invention after a removal step removing a second dielectric layer. In embodiments of the invention a wet etch removal of the second dielectric layer is used. A Diluted Hydrogen fluoride (DHF) etch has a good selectivity to remove SiO2 based dielectric with minimal removal of SiC or SiN based dielectrics. The structure as shown in the drawing has a via contact interconnect element protruding upwards from the top face of the first dielectric layer 103. In other words, the top face of the interconnect element is higher than the top face of the surrounding first dielectric layer 103.

Figure 9:
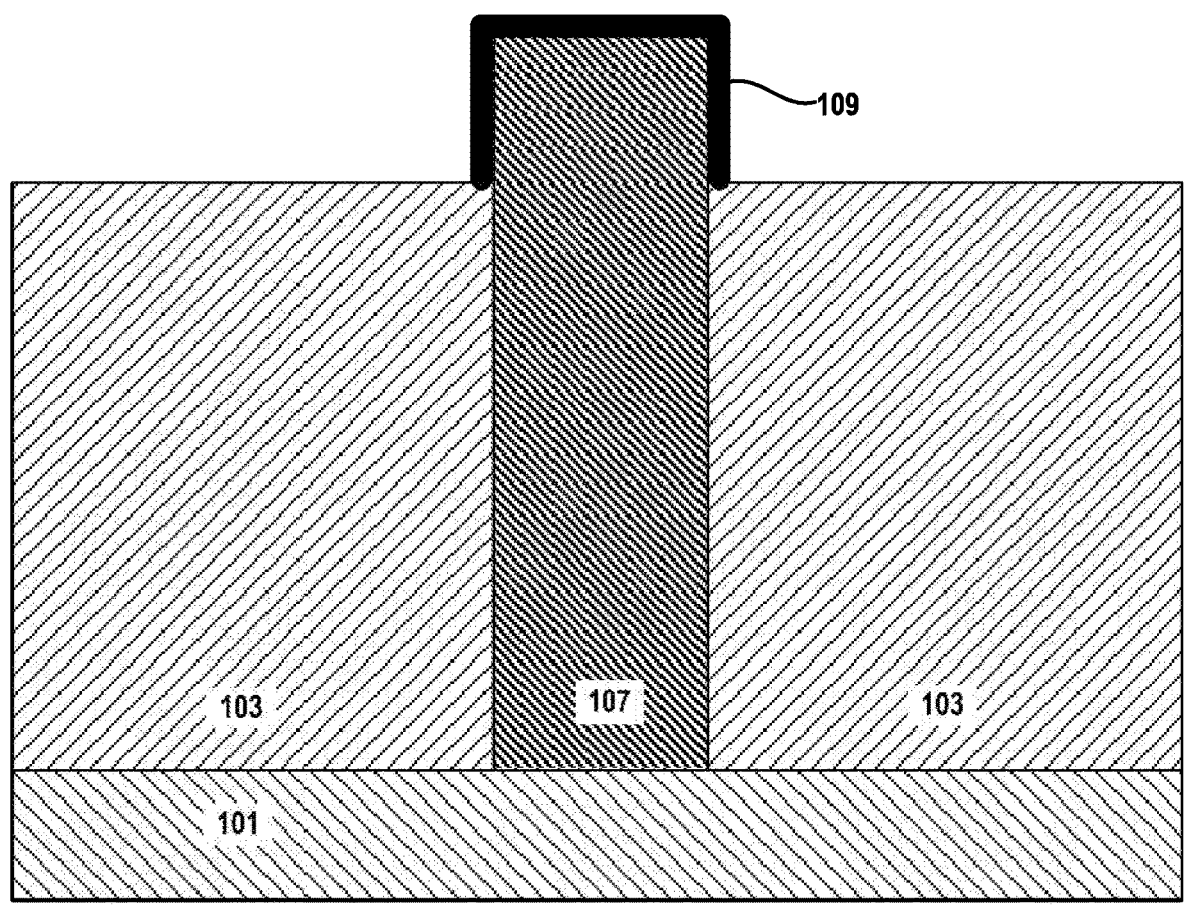
FIG. 9 is a cross-sectional diagram of the via or contact variant of a first embodiment of the invention after a barrier layer deposition.

FIG. 9 is a cross-sectional diagram of the via or contact variant of a first embodiment of the invention after a barrier layer deposition. In this drawing, a selective deposition of a barrier layer 109 over the exposed top portion of the via metal 107 is performed. If the via metal 107 is copper, selective deposition of Ta, Ru, Co, Rh, W and their nitrides or combination of the same as a barrier layer is performed in an embodiment of the invention. The selective deposition process only deposits the barrier layer on the surface of the conductor, copper in this example. The deposition of barrier layer material(s) can be accomplished utilizing any conventional deposition process including, for example, atomic layer deposition (ALD), chemical vapor deposition (CVD) and plasma enhanced chemical vapor deposition (PECVD). The thickness of the barrier layer can vary depending on the number of metal layers within the barrier 109. Typically, the barrier layer 109 has a thickness from 1 nm to 20 nm, with a thickness from 2 nm to 10 nm being more typical.

A selective deposition of the barrier layer is desired in the invention so that the barrier layer does not form between the dielectric layers. The barrier layer between the dielectric layers would cause shorts as the barrier layers are conductive materials. Unlike prior art processing, the excess barrier layer is not removed in a subsequent planarization process.

Figure 10:
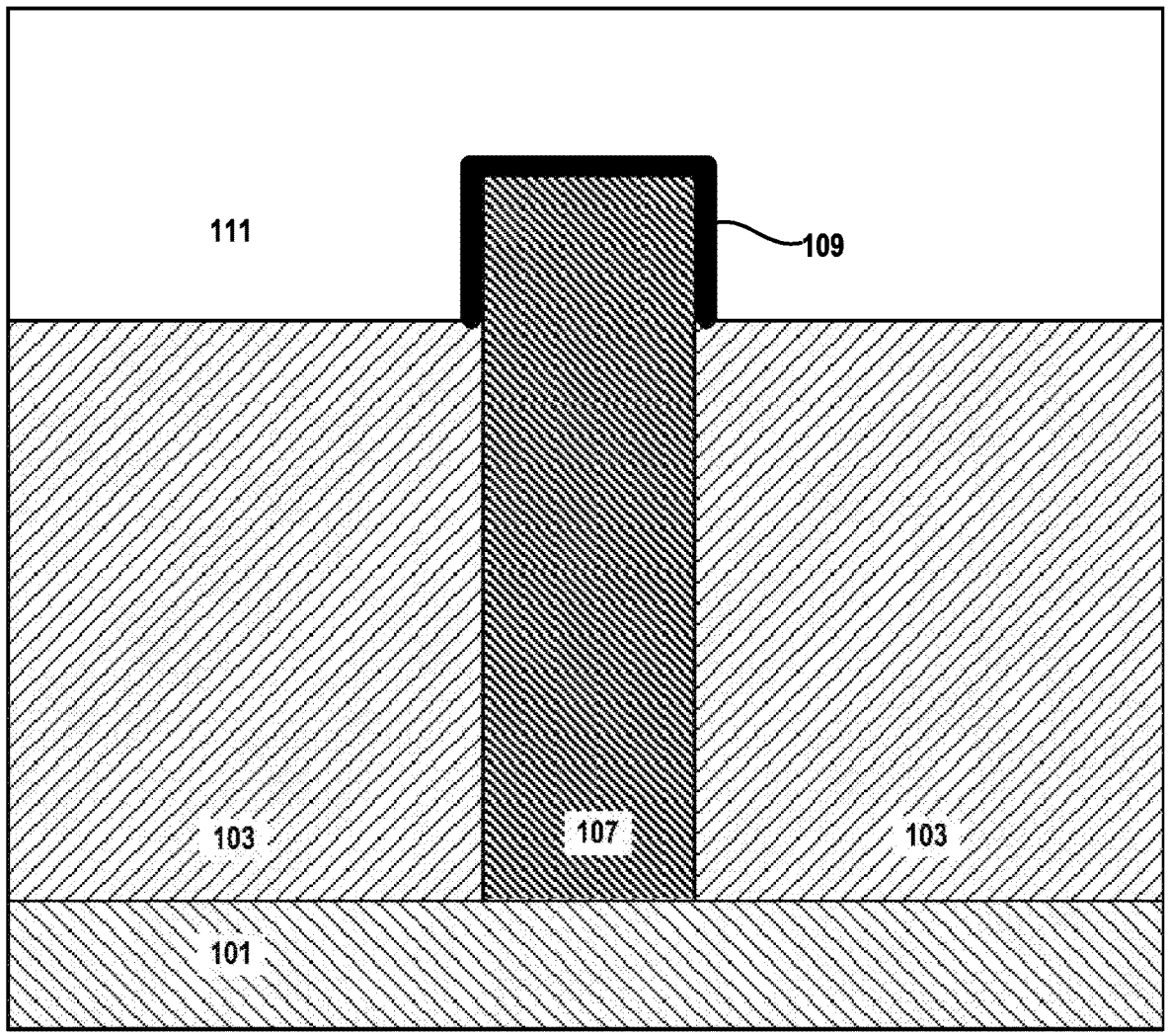
FIG. 10 is a cross-sectional diagram of the via or contact variant of a first embodiment of the invention after a second dielectric layer deposition.

FIG. 10 is a cross-sectional diagram of the via or contact variant of a first embodiment of the invention after a second dielectric layer deposition. In this drawing, a second layer of the second dielectric 111 is deposited. Optionally, the second layer of dielectric is planarized, e.g., through the use of a CMP step.

Figure 11:
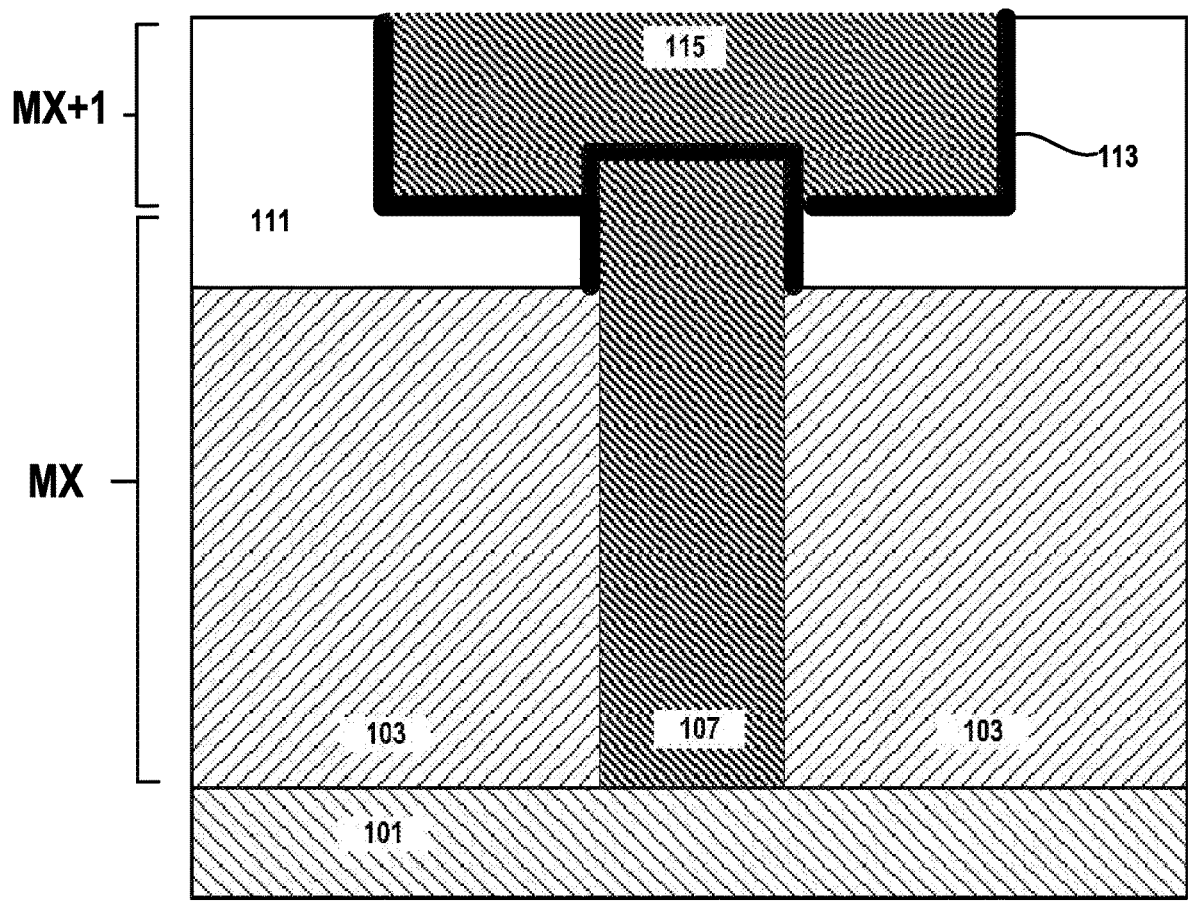
FIG. 11 is a cross-sectional diagram of the via or contact variant of a first embodiment of the invention after patterning, etch, barrier layer deposition, metal layer deposition and planarization steps are performed.

FIG. 11 is a cross-sectional diagram of the via or contact variant of a first embodiment of the invention after patterning, etch, barrier layer deposition, metal layer deposition and planarization steps are performed. These steps are used to pattern a conductive line pattern over the via contact metallization 107. These steps are largely conventional single Damascene steps. First, a pattern for the conductive lines is provided over the dielectric layer 111, e.g., using a photoresist layer and a lithography step. Next, the dielectric layer 111 is etched forming a set of trenches, i.e. recesses, for the conductive lines. In preferred embodiments, at least part of the barrier layer covered top portion of the via contact element 107 is revealed. Next, a barrier layer is deposited in the trenches and over the field areas of the dielectric 111. One or more metal deposition steps fill the trenches. Finally, a planarization step such as CMP is performed to form the conductive line pattern 115 and remove the excess metal and barrier layer (not shown) from the field areas on top of the dielectric surrounding the conductive lines. An advantage in having the via contact 107 "poke up" into the conductive line layer 115 is that the increased contact area improves both mechanical strength and electrical conductivity. The conductive line layer 115 is a second interconnect element in the overall interconnect structure.

In the drawing, MX designates the first level of metal, i.e. the via contact, while MX+1 designates the second level of the metal, the conductive lines, in the overall interconnect structure. As shown, the very top of the via contact element 107 is in the space designated for the second level of metal. Barrier layer 109, 111 separates the interconnect elements 107, 115 from the second dielectric layer 111, however, none is needed between the interconnect element 107 and the first dielectric layer 103.

Figure 12:
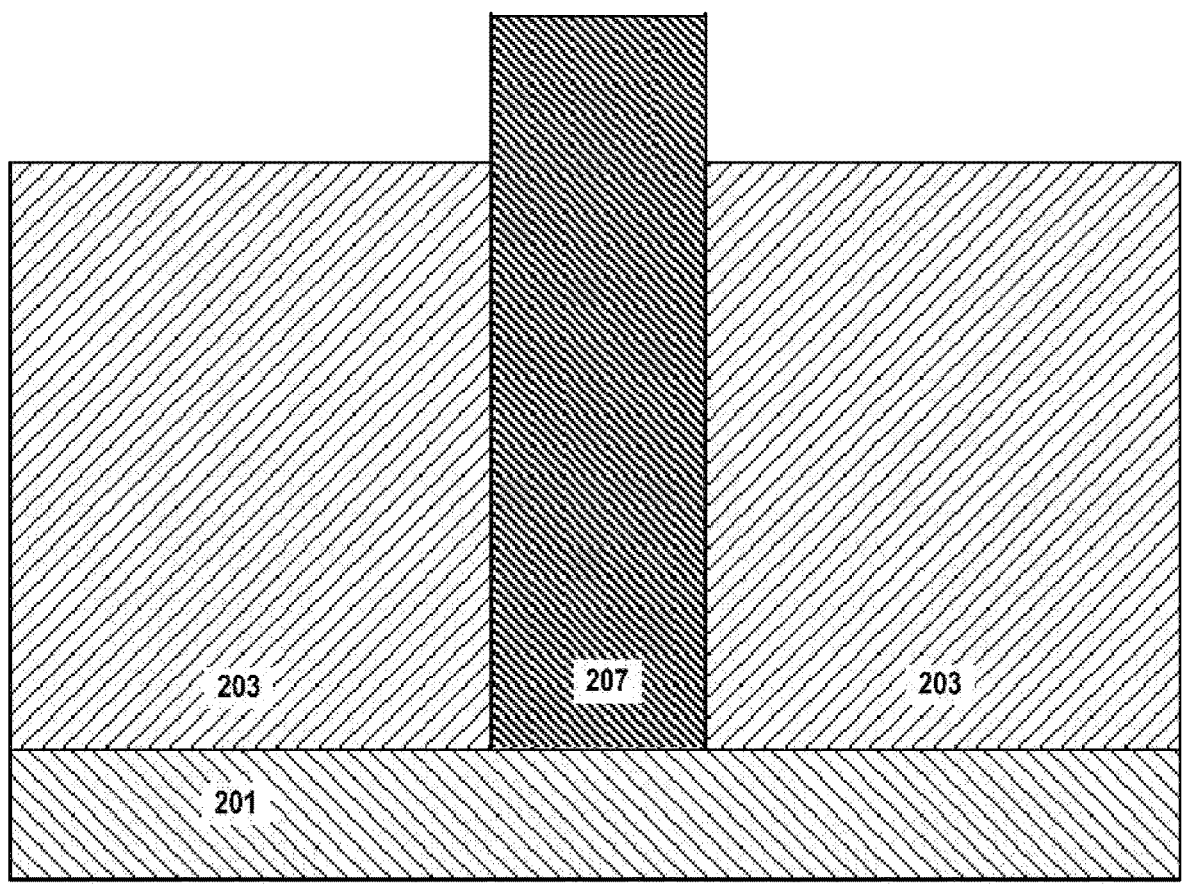
FIG. 12 is a cross-sectional diagram of the via or contact variant of a second embodiment of the invention after a removal step of the second dielectric layer.

FIG. 12 is a cross-sectional diagram of the via or contact variant of a second embodiment of the invention after a removal step of the second dielectric layer. This drawing depicts the structure at the same process point as depicted in FIG. 6 for the first embodiment. The substrate 201 supports a first layer 203 of the first dielectric which a via contact interconnect element 207 is fabricated using processes similar to those discussed above for the respective materials.

Figure 13:
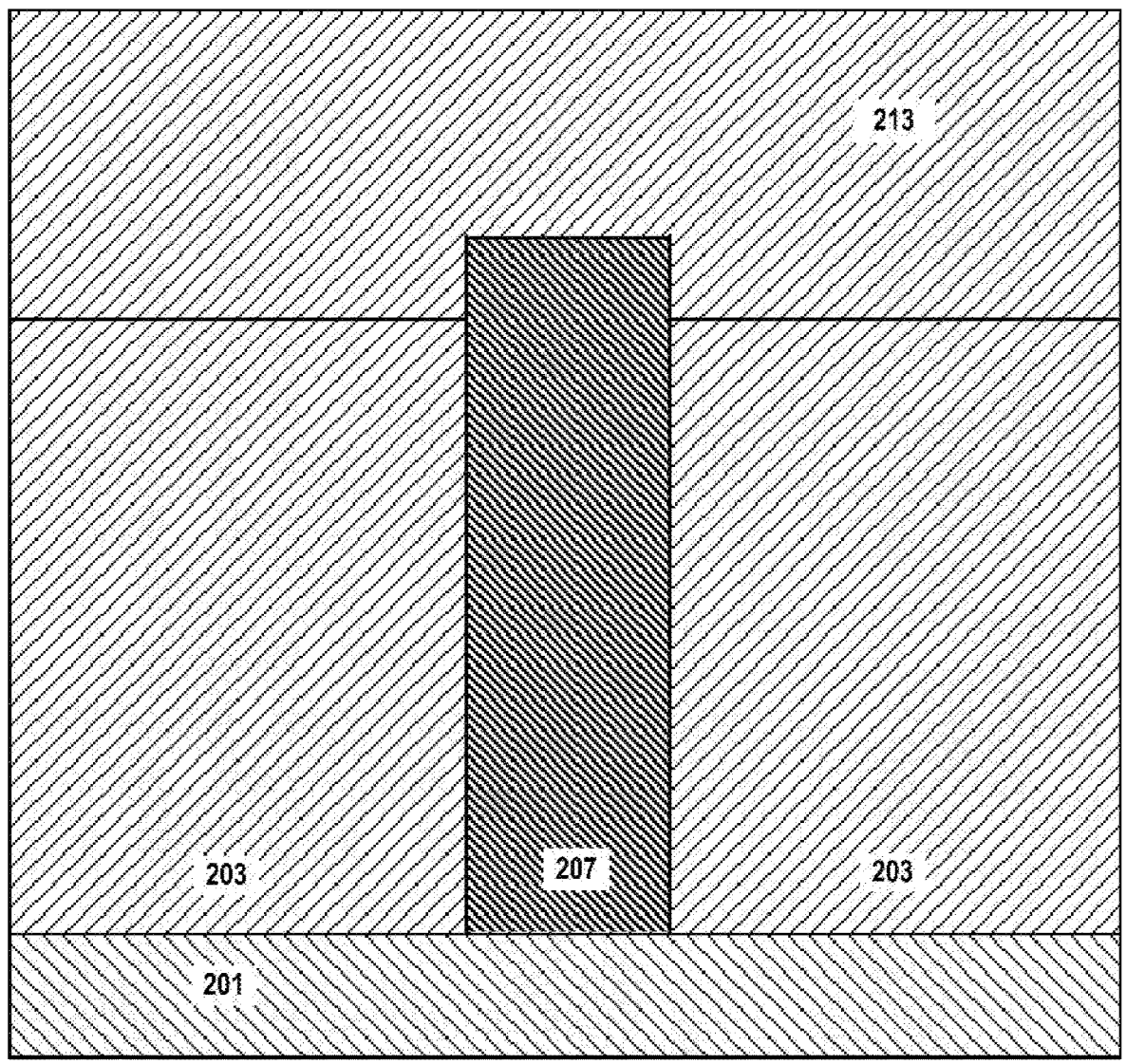
FIG. 13 is a cross-sectional diagram of the via or contact variant of a second embodiment of the invention after a second layer of the first dielectric.

FIG. 13 is a cross-sectional diagram of the via or contact variant of a second embodiment of the invention after a second layer of the first dielectric. In the drawing, instead of a layer of the second dielectric, a second layer 213 of the first dielectric is deposited on the structure.

Figure 14:
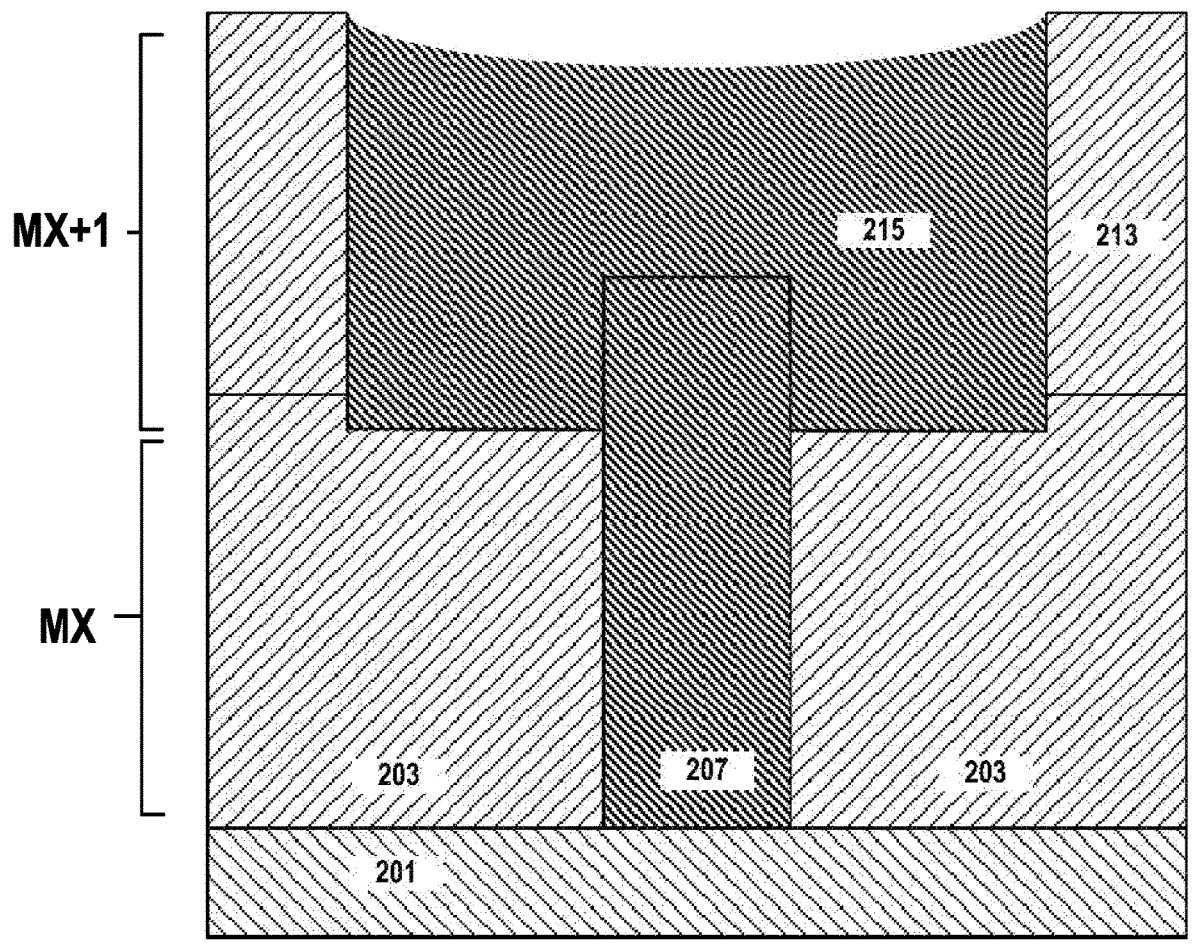
FIG. 14 is a cross-sectional diagram of the via or contact variant of a second embodiment of the invention after patterning, etch, metal layer deposition and planarization steps are performed.

FIG. 14 is a cross-sectional diagram of the via or contact variant of a second embodiment of the invention after patterning, etch, metal layer deposition and planarization steps are performed. After the patterning for the conductive line layer 215, the etch is performed in the second layer 213 at least to the top face of the via contact 207. In this drawing, the etch proceeds through the second layer of the first dielectric and into the first layer of the dielectric 203 and past the top face of the via contact 207 so that a top portion of the via contact interconnect occupies the second recess formed for the conductive line pattern. In other versions of the second embodiment, the etch is confined to the second layer 213 of the first dielectric. A metal layer 215 is deposited in the set of trenches and planarized away in the field areas. Note that in this embodiment, barrier layers are not used because the metal does not diffuse into first dielectric. However, the top surface of the metal conductive line layer 215 is dished during the CMP process. The conductive line layer 215 is a second interconnect element in the overall interconnect structure.

As above, MX designates the first level of metal, i.e. the via contact, while MX+1 designates the second level of the metal, the conductive lines 215, in the overall interconnect structure. As in the first embodiment, the top of the via contact interconnect element 207 occupies a small portion of the second metal layer MX+1.

Figure 15:
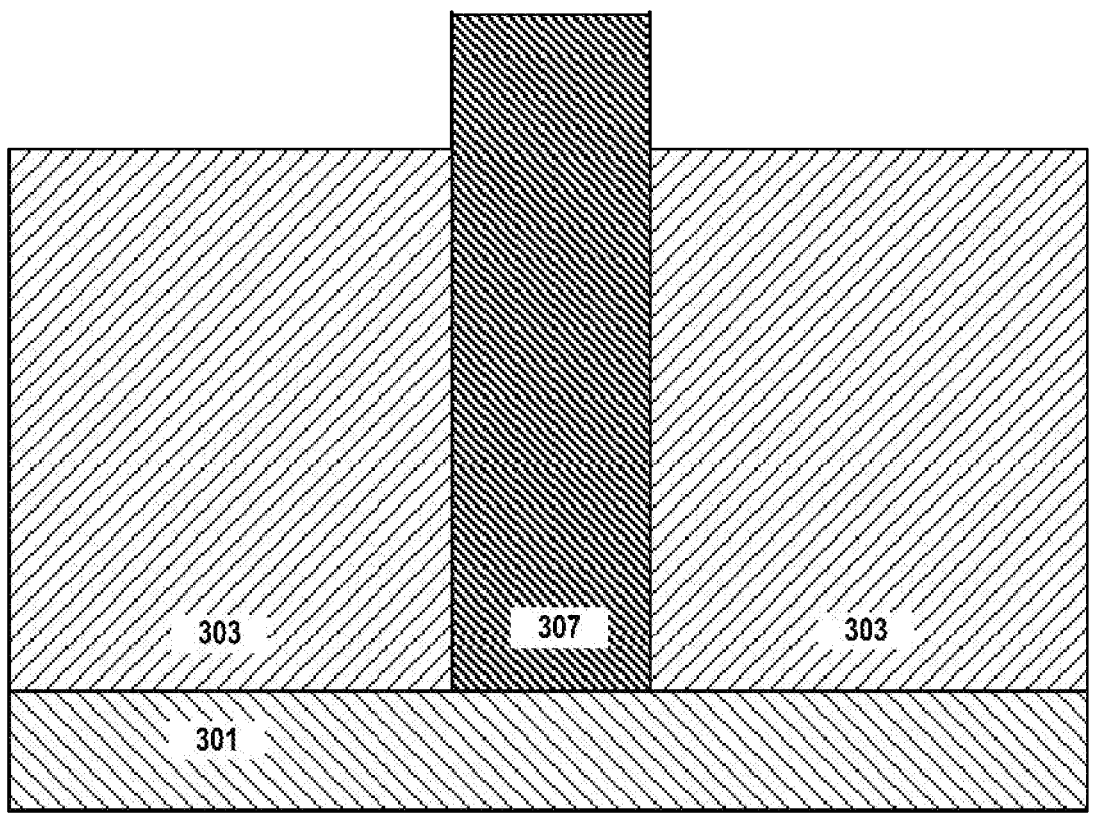
FIG. 15 is a cross-sectional diagram of the via or contact variant of a third embodiment of the invention after a removal step of the second dielectric layer.

FIG. 15 is a cross-sectional diagram of the via or contact variant of a third embodiment of the invention after a removal step of the second dielectric layer. This drawing depicts the structure at the same process point as depicted in FIG. 6 for the first embodiment. The substrate 301 supports a first layer 303 of the first dielectric in which a via contact interconnect element 307 is fabricated using processes similar to those discussed above for the respective materials in the structure.

Figure 16:
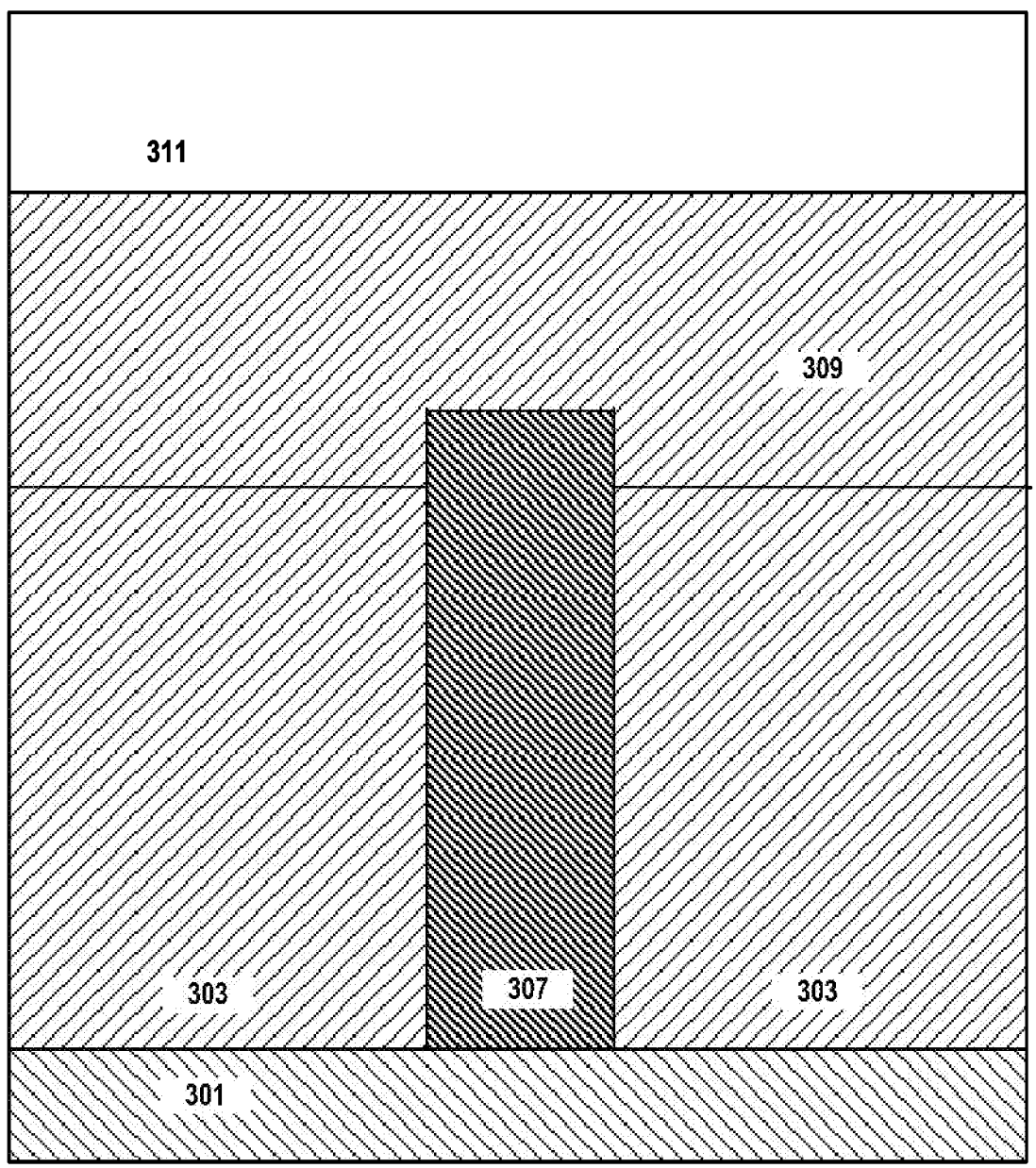
FIG. 16 is a cross-sectional diagram of the via or contact variant of a third embodiment of the invention after a first dielectric deposition and second dielectric deposition steps are performed.

FIG. 16 is a cross-sectional diagram of the via or contact variant of a third embodiment of the invention after a first dielectric deposition and second dielectric deposition steps are performed. In this drawing, a second layer 309 of the first dielectric and a second layer 311 of the second dielectric are deposited over the structure thereby embedding the via contact element in layers of dielectric.

Figure 17:
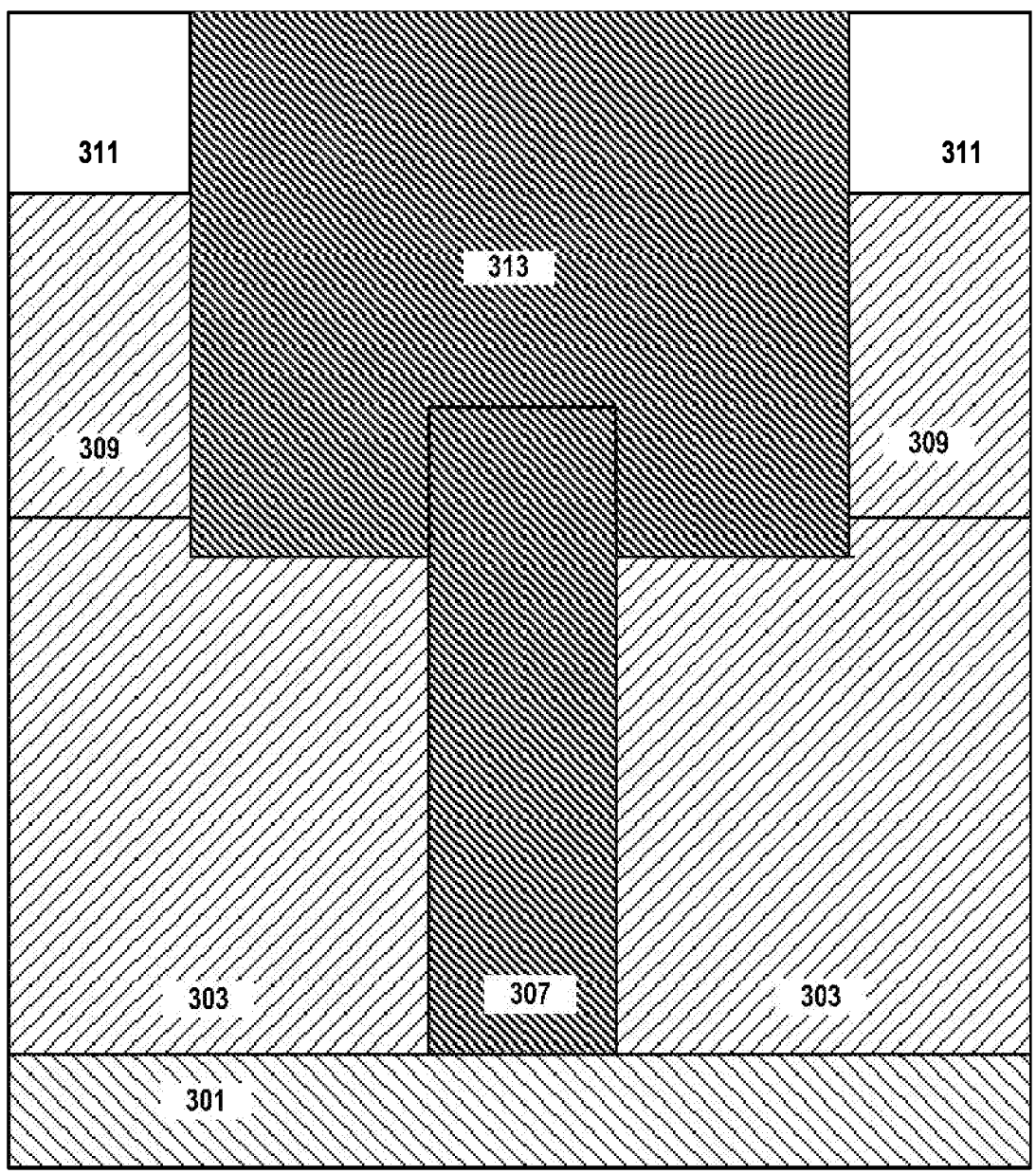
FIG. 17 is a cross-sectional diagram of the via or contact variant of a third embodiment of the invention after patterning, etch, metal layer deposition and planarization steps are performed.

FIG. 17 is a cross-sectional diagram of the via or contact variant of a third embodiment of the invention after patterning, etch, metal layer deposition and planarization steps are performed. After the patterning for the conductive line layer 313, the etch is performed in the second layer 311 of the second dielectric and the second layer 309 of the first dielectric at least to the top face of the via contact 307. In this drawing, the etch proceeds through the second layer 309 of the first dielectric and into the first layer of the first dielectric 303 and past the top face of the via contact 307. In other embodiments the etch is confined to the top layers 311, 309 of dielectric. A metal layer 313 is deposited in the set of trenches and planarized away in the field areas. As the top layer of dielectric is the second dielectric 311, the top surface of the metal for the conductive line 313 is shown planar, without dishing, with respect to the top surface of the second dielectric 311. As in prior embodiments, the top of the via contact interconnect structure 307 is in the conductive line recess used to create the conductive line interconnect element 313.

Figure 18:
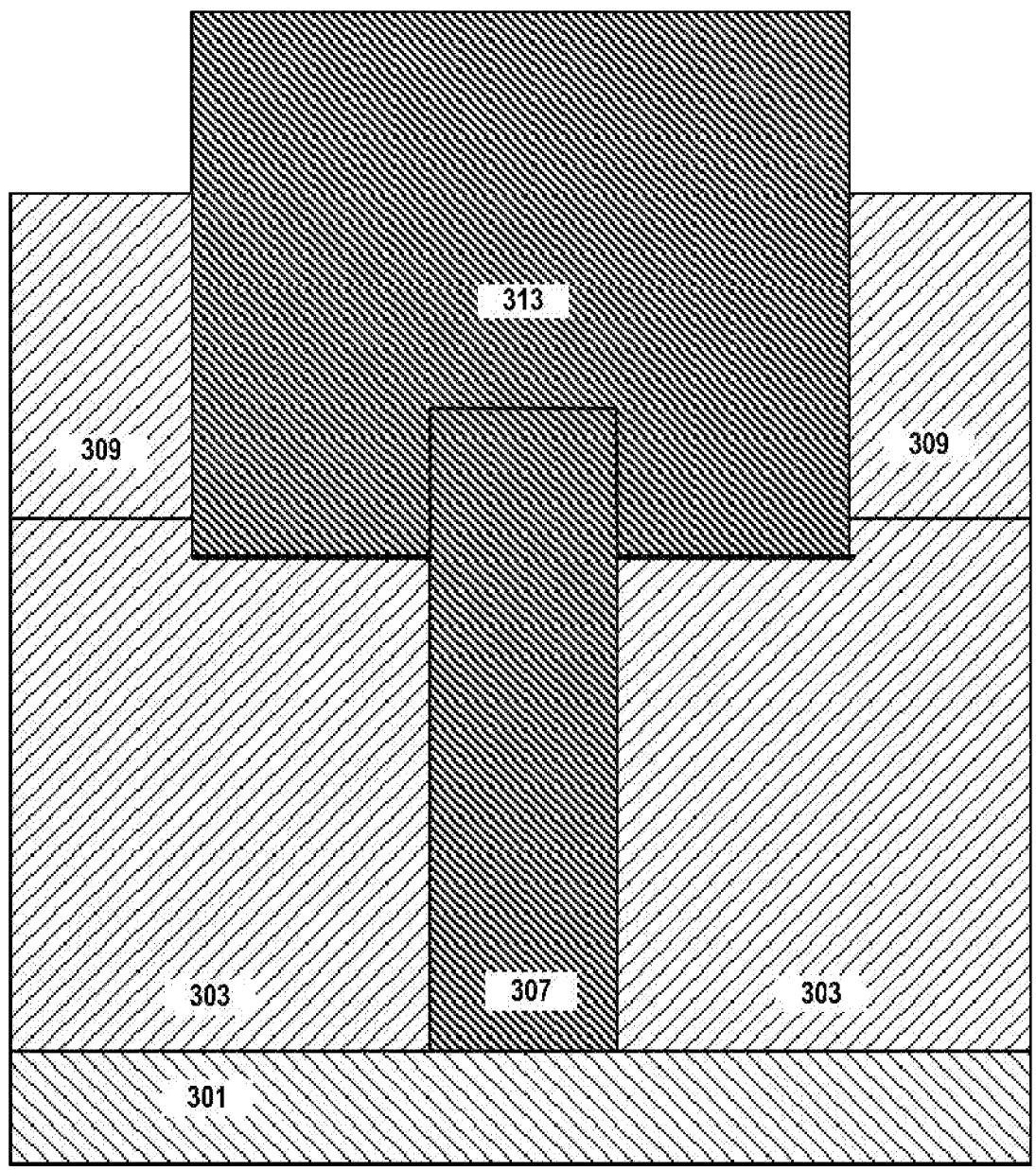
FIG. 18 is a cross-sectional diagram of the via or contact variant of a third embodiment of the invention after removal of the second dielectric layer is performed.

FIG. 18 is a cross-sectional diagram of the via or contact variant of a third embodiment of the invention after removal of the second dielectric layer is performed. As described above, a wet etch process can be used to remove the second dielectric layer. This creates the structure as shown in which the metal for the conductive line 313 protrudes upward from the top surface of the second layer 309 of the first dielectric. The top surface of the conductive line element 313 is higher than the top surface of the surrounding dielectric layer 309.

Figure 19:
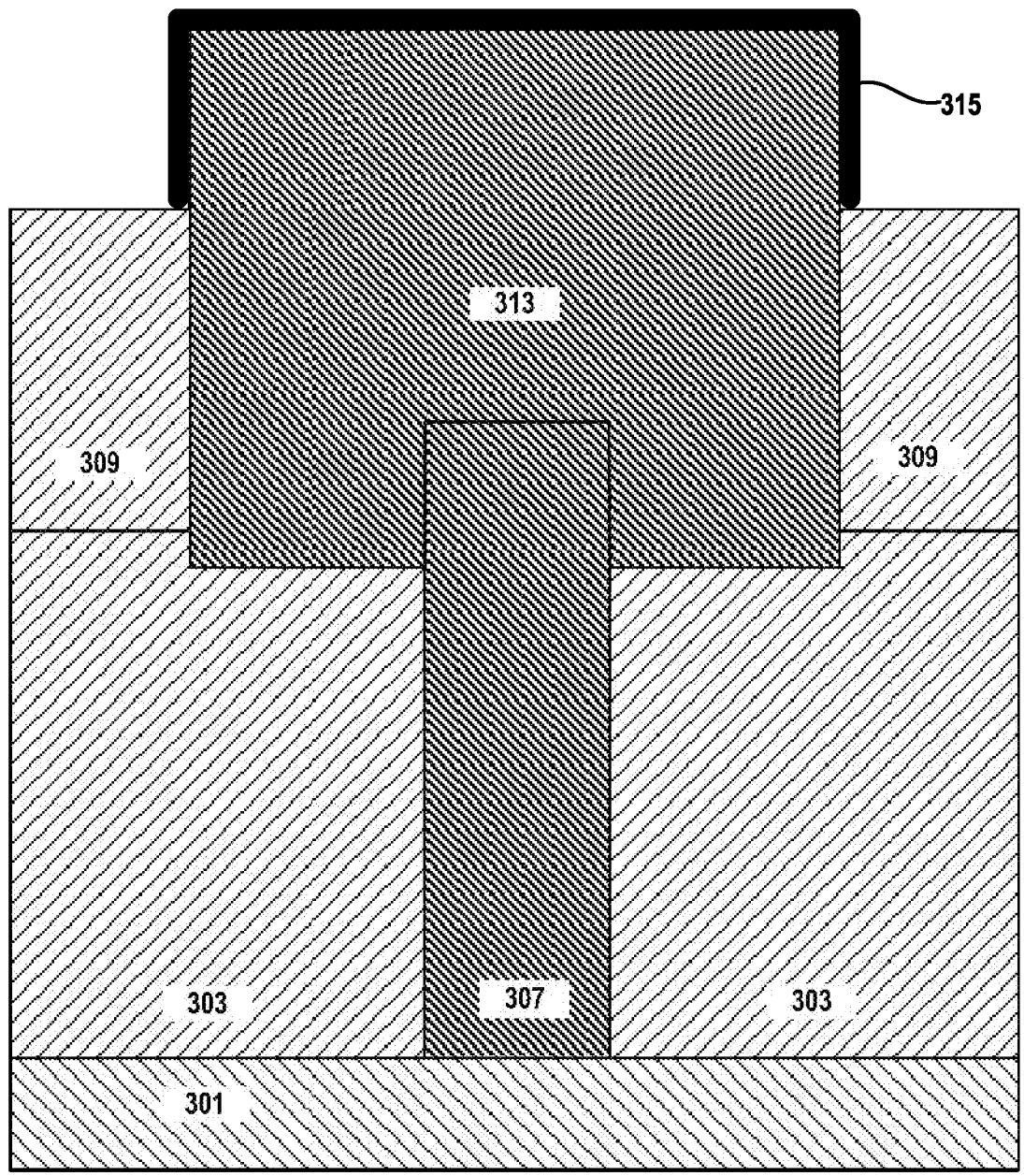
FIG. 19 is a cross-sectional diagram of the via or contact variant of a third embodiment of the invention after deposition of a barrier layer is performed.

FIG. 19 is a cross-sectional diagram of the via or contact variant of a third embodiment of the invention after deposition of a barrier layer is performed. Next, as shown, a barrier layer 315 is selectively deposited on the exposed metal 313. That is, the barrier layer 315 is deposited on a top portion of the interconnect element 313.

Figure 20:
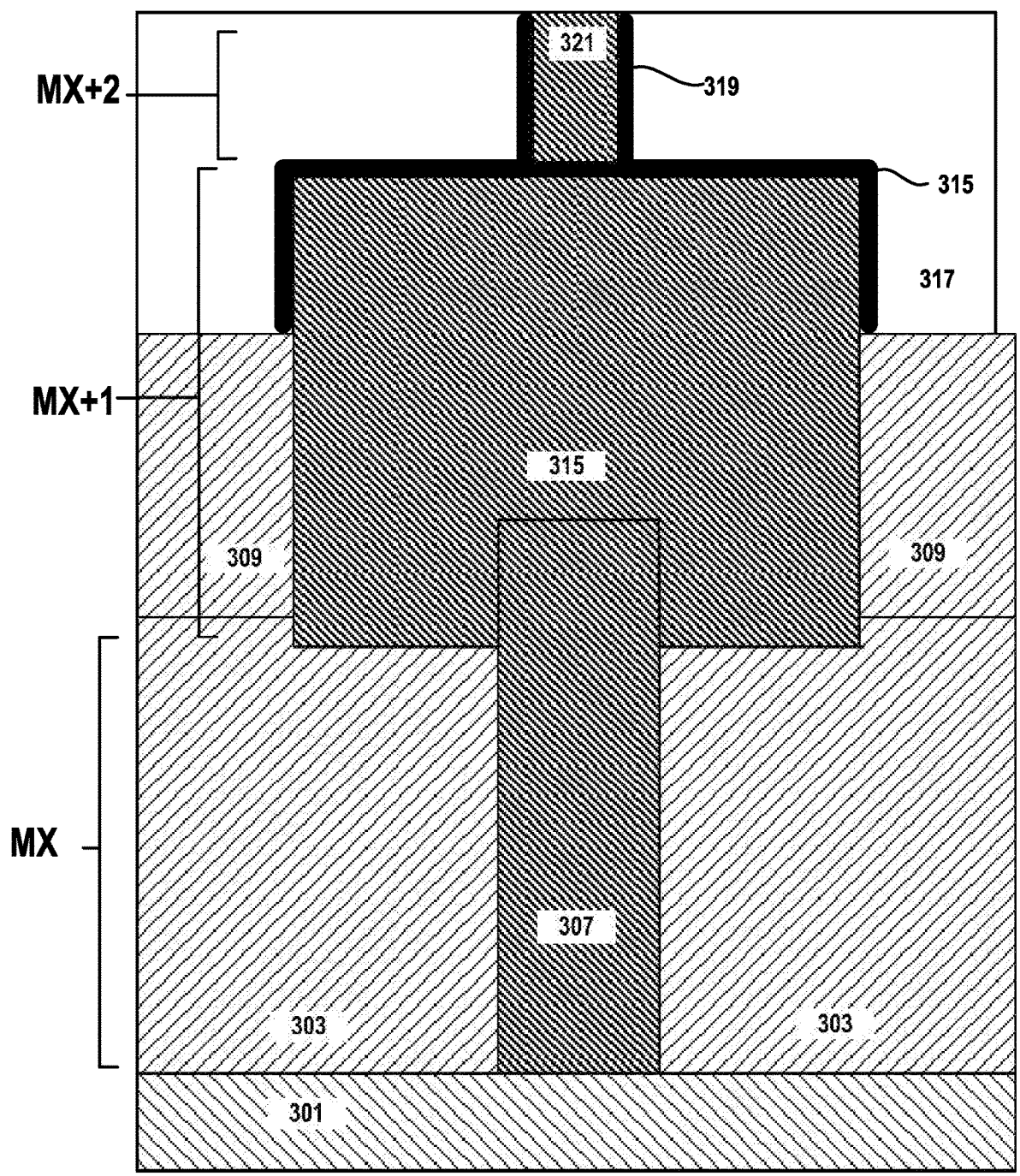
FIG. 20 is a cross-sectional diagram of the via or contact variant of a third embodiment of the invention after deposition of a second dielectric layer, patterning, etch, depositing a barrier layer, depositing a metal layer and planarization steps are performed.

FIG. 20 is a cross-sectional diagram of the via or contact variant of a third embodiment of the invention after deposition of a second dielectric layer, patterning, etch, depositing a barrier layer, depositing a metal layer and planarization steps are performed. This sequence of steps are used to provide the via or contact layer. In the structure, a third layer 317 of the second dielectric is deposited and patterned for the third set of interconnect elements, a set of via contact interconnect elements. Depositions of the barrier layer 319 and metal layer 321 are carried out. As before, a planarization step is used to remove excess barrier layer and metal material and form the metal via contact elements 321.

As described above, in the drawing, MX designates the first level of metal, i.e. the first via contact, while MX+1 designates the second level of the metal, the conductive lines, in the overall interconnect structure. MX+2 designates the third metal level, a second via or contact level. A portion of the first via contact element 307 is in the space designated for the second level of metal. As in other embodiments, barrier layers 315, 319 are used to separate the interconnect elements 315, 321 from the second dielectric 317. No barrier layer is needed for the first dielectric. In embodiments where a first portion of an interconnect element is embedded in the first dielectric and a second portion is embedded in the second dielectric, only the second portion of the interconnect element is covered by the barrier layer.

The conductive line variant of a first embodiment of the invention shown in FIG. 3 and the a via and conductive line variants depicted in FIG. 4 would proceed similarly for the different embodiments, using a starting conductive line or a starting via and conductive line combination as shown in the drawings above. That is, instead of the pillar created for the via in the examples above, a conductive line pattern or a conductive line pattern with underlying vias would be formed. An upper portion of the pattern would be revealed after the removal of the second dielectric as shown in FIG. 8. Then, the next layer, a via layer would be built. This is similar to the processes depicted in FIGS. 19 and 20, but the metallization of the underlying element would be a single unit and deposited uninterrupted, i.e. accomplished in a single set of deposition steps, uninterrupted by etch or dielectric deposition steps (the "single unit" being either a conductive line or a conductive line/via combination)). Also, there would be a single layer of the first dielectric.

The resulting structures can be included within integrated circuit chips, which can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

While only one or a limited number of features are illustrated in the drawings, those ordinarily skilled in the art would understand that many different types of features could be simultaneously formed with the embodiment herein and the drawings are intended to show simultaneous formation of multiple different types of features. However, the drawings have been simplified to only show a limited number of features for clarity and to allow the reader to more easily recognize the different features illustrated. This is not intended to limit the invention because, as would be understood by those ordinarily skilled in the art, the invention is applicable to structures that include many of each type of feature shown in the drawings.

While the above describes a particular order of operations performed by certain embodiments of the invention, it should be understood that such order is exemplary, as alternative embodiments may perform the operations in a different order, combine certain operations, overlap certain operations, or the like. References in the specification to a given embodiment indicate that the embodiment described may include a particular feature, structure, or characteristic, but every embodiment may not necessarily include the particular feature, structure, or characteristic.

In addition, terms such as "right", "left", "vertical", "horizontal", "top", "bottom", "upper", "lower", "under", "below", "underlying", "over", "overlying", "parallel", "perpendicular", etc., used herein are understood to be relative locations as they are oriented and illustrated in the drawings (unless otherwise indicated). Terms such as "touching", "on", "in direct contact", "abutting", "directly adjacent to", etc., mean that at least one element physically contacts another element (without other elements separating the described elements).

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

I claim:

1. A method for fabricating an interconnect structure for integrated circuit comprising:
providing a recess in a first dielectric layer comprising a first dielectric and a second dielectric layer comprised of a second dielectric, the first and second dielectric layers disposed over a substrate, the second dielectric layer disposed over the first dielectric layer;
filling the recess with a metal conductor;
performing a chemical mechanical polishing process to remove the metal conductor from field areas on the second dielectric layer; and
after the chemical mechanical polishing process, removing the second dielectric layer, creating an interconnect element having a top face which protrudes higher than a top face of the first dielectric layer, the metal conductor of the interconnect element having direct contact with a surface of the first dielectric layer forming the recess.

2. The method as recited in claim 1, wherein the interconnect element is a via contact interconnect element.

3. The method as recited in claim 1, wherein the interconnect element is a conductive line interconnect element.

4. The method as recited in claim 1, wherein the interconnect element is a combination conductive line, via contact interconnect element.

5. The method as recited in claim 1, further comprising:
selectively depositing a barrier layer on a top portion of the interconnect element;
depositing a third dielectric layer comprised of the second dielectric over the barrier layer and the first dielectric layer;
forming a second recess in the third dielectric layer, the second recess revealing at least part of the top portion of the interconnect element;
depositing a barrier layer over the second recess and the third dielectric layer;
filling the second recess with a metal conductor; and
performing a chemical mechanical polishing process to remove the barrier layer and the metal conductor from field areas on the third dielectric layer, forming a second interconnect element in the second recess, the metal conductor in the second interconnect element separated from the second dielectric in the third dielectric layer by the barrier layer.

6. The method as recited in claim 1, further comprising:
depositing a third dielectric layer comprised of the first dielectric over the interconnect element and the first dielectric layer;
forming a second recess in the third dielectric layer, the second recess revealing a top portion of the interconnect element;
filling the second recess with a metal conductor; and
performing a chemical mechanical polishing process to remove the metal conductor from field areas on the third dielectric layer, forming a second interconnect element in the second recess, the metal conductor in the second interconnect element in direct contact with the first dielectric in the third dielectric layer.

7. The method as recited in claim 1, further comprising:
depositing a third dielectric layer comprised of the first dielectric over the interconnect element and the first dielectric layer;
depositing a fourth layer comprised of the second dielectric over the third dielectric layer;
forming a second recess in the third and fourth dielectric layers, the recess revealing a top portion of the interconnect element;
filling the second recess with a metal conductor; and
performing a chemical mechanical polishing process to remove the metal conductor from field areas on the fourth dielectric layer, forming a second interconnect element in the second recess, the metal conductor in the second interconnect element in direct contact with the first dielectric in the third dielectric layer; and
removing the fourth dielectric layer so that the second interconnect element has a top face which protrudes higher than a top face of the third dielectric layer.

8. The method as recited in claim 7, further comprising:
selectively depositing a barrier layer on the second interconnect element;
depositing a fifth dielectric layer comprised of the second dielectric over the barrier layer and the third dielectric layer;
forming a third recess in the fifth dielectric layer, the third recess revealing a top portion of the second interconnect element;
depositing a barrier layer over the third recess and the third dielectric layer;
filling the third recess with a metal conductor; and
performing a chemical mechanical polishing process to remove the barrier layer and the metal conductor from field areas on the fifth dielectric layer, forming a third interconnect element in the third recess, the metal conductor in the second interconnect element separated from the second dielectric in the fifth dielectric layer by the barrier layer.

9. The method as recited in claim 1, wherein the metal conductor is copper and does not comprise a barrier material and wherein the first dielectric is selected from the group of silicon carbide (SiC), silicon nitride (SiN) and other oxygen free dielectrics.

10. The method as recited in claim 1, wherein the metal conductor comprises copper, does not comprise a barrier material and does not substantially diffuse into the first dielectric in absence of a barrier layer.

11. The method as recited in claim 1, wherein removing the second dielectric layer is performed immediately after the chemical mechanical polishing process by a different type of process than the chemical mechanical polishing process.

12. The method as recited in claim 1, wherein the metal conductor does not comprise a separate barrier material in a portion of the metal conductor which is in direct contact with the recessed surface in the first dielectric.

13. The method as recited in claim 1, wherein the chemical mechanical polishing process does not remove all of the second dielectric layer.

14. The method as recited in claim 1, wherein removing the second dielectric layer is performed by an etching step.

15. The method as recited in claim 1, wherein the recess in the second dielectric layer and the first dielectric layer forms a set of sidewalls in the second dielectric layer and the first dielectric layer with which the metal conductor is in direct contact.

16. The method as recited in claim 1, wherein the first and second dielectric layers are disposed in a vertical arrangement with respect to the substrate.

* * * * *